United States Patent
Lee et al.

(10) Patent No.: US 9,105,840 B2
(45) Date of Patent: Aug. 11, 2015

(54) ELECTRONIC DEVICE AND METHOD FOR FABRICATING THE SAME

(71) Applicant: SK HYNIX INC., Icheon (KR)

(72) Inventors: Jong-Chul Lee, Icheon (KR); Ja-Chun Ku, Icheon (KR); Sung-Kyu Min, Icheon (KR); Byung-Jick Cho, Icheon (KR); Seung-Beom Baek, Icheon (KR); Hyo-June Kim, Icheon (KR); Won-Ki Ju, Icheon (KR); Hyun-Kyu Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/199,915

(22) Filed: Mar. 6, 2014

(65) Prior Publication Data

US 2015/0085559 A1    Mar. 26, 2015

(30) Foreign Application Priority Data

Sep. 25, 2013  (KR) .......................... 10-2013-0113863

(51) Int. Cl.
| | |
|---|---|
| *G11C 11/34* | (2006.01) |
| *H01L 45/00* | (2006.01) |
| *H01L 43/02* | (2006.01) |
| *G11C 13/00* | (2006.01) |

(52) U.S. Cl.
CPC .......... *H01L 45/122* (2013.01); *G11C 13/0007* (2013.01); *H01L 43/02* (2013.01); *H01L 45/06* (2013.01); *G11C 13/0002* (2013.01); *G11C 2213/71* (2013.01)

(58) Field of Classification Search
CPC ................................................. G11C 13/0007
USPC ........................................................ 365/148
See application file for complete search history.

(56) References Cited

U.S. PATENT DOCUMENTS

| | | | |
|---|---|---|---|
| 2012/0147649 A1* | 6/2012 | Samachisa et al. ............. | 365/51 |
| 2012/0317334 A1* | 12/2012 | Suzuki et al. ................. | 711/103 |
| 2014/0146589 A1* | 5/2014 | Park et al. ....................... | 365/51 |

FOREIGN PATENT DOCUMENTS

KR    10-2008-0096432 A    10/2008

OTHER PUBLICATIONS

Gun Hwan Kim et al., "Schottky diode with excellent performance for large integration density of crossbar resistive memory", Applied Physics Letters, May 24, 2012, pp. 1-3, vol. 100, No. 213508, American Institute of Physics.

* cited by examiner

*Primary Examiner* — Hoai V Ho
*Assistant Examiner* — Jay Radke

(57) ABSTRACT

According to embodiments, a semiconductor memory may include: a variable resistance pattern disposed over a substrate and extended in a first direction; first and second structures including a plurality of interlayer dielectric layers and a plurality of conductive layers which are alternately stacked over the substrate, and contacted with one side surface and the other side surface of the variable resistance pattern, respectively, wherein the first stacked structure has a line shape extended in a first direction and the second stacked structure has a pillar shape; and a pillar-shaped conductive pattern contacted with one side surface of the second stacked structure, which is not contacted with the variable resistance pattern.

17 Claims, 10 Drawing Sheets

ELECTRONIC DEVICE AND METHOD FOR FABRICATING THE SAME

CROSS-REFERENCE TO RELATED APPLICATION

The present application claims priority of Korean Patent Application No. 10-2013-0113863, entitled "ELECTRONIC DEVICE AND METHOD FOR FABRICATING THE SAME" and filed on Sep. 25, 2013, which is incorporated by reference in its entirety herein.

TECHNICAL FIELD

Embodiments relate to memory circuits or devices and their applications in electronic devices or systems.

BACKGROUND

Recently, as electronic appliances pursue goals such as miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

Embodiments include memory circuits or devices and their applications in electronic devices or systems and various implementations of an electronic device which is capable of increasing the integration degree, improving performance, and simplifying a fabrication process.

In one aspect, there is provided an electronic device including a semiconductor memory. The semiconductor memory may include: a variable resistance pattern disposed over a substrate and extended in a first direction; first and second structures including a plurality of interlayer dielectric layers and a plurality of conductive layers which are alternately stacked over the substrate, and contacted with one side surface and the other side surface of the variable resistance pattern, respectively, wherein the first stacked structure has a line shape extended in a first direction and the second stacked structure has a pillar shape; and a pillar-shaped conductive pattern contacted with one side surface of the second stacked structure, which is not contacted with the variable resistance pattern.

Implementations of the above device may include one or more of the following.

The second stacked structure comprises a plurality of second stacked structures arranged in the first direction so as to be spaced from each other, and the conductive pattern comprises a plurality of conductive patterns contacted with one side surfaces of the respective second stacked structures. The electronic device further comprises an insulating pattern buried in spaces between the respective second stacked structures and between the respective conductive patterns. A memory cell is formed at an intersection between the conductive layer of the first stacked structure and the conductive pattern. The variable resistance pattern has a resistance state which is changed according to a voltage or current applied through the conductive layers at both sides of the variable resistance pattern. The variable resistance pattern comprises a metal oxide, a phase change material, a ferroelectric material, or a ferromagnetic material. The variable resistance pattern comprises an oxygen-poor metal oxide layer and an oxygen-rich metal oxide layer, and the oxygen-poor metal oxide layer is contacted with the first stacked structure, and the oxygen-rich metal oxide layer is contacted with the second stacked structure. The variable resistance pattern comprises an oxygen-poor metal oxide layer and an oxygen-rich metal oxide layer, the oxygen-poor metal oxide layer has a line shape extended in the first direction, and the oxygen-rich metal oxide layer has a shape to surround the sidewalls and the bottom of the oxygen-poor metal oxide layer, and is contacted with the first and second stacked structures. An end part of the first stacked structure in the first direction has a step shape. In a second direction crossing the first direction, the second stacked structure, the variable resistance pattern, and the first stacked structure are sequentially arranged at one side of the conductive pattern, and the second stacked structure, the variable resistance pattern, and the first stacked structure are sequentially arranged in the other side of the conductive pattern. In a second direction crossing the first direction, the variable resistance pattern, the second stacked structure, and the conductive pattern are sequentially arranged at one side of the first stacked structure, and the variable resistance pattern, the second stacked structure, and the conductive pattern are sequentially arranged in the other side of the first stacked structure. The pillar-shaped conductive pattern is not in direct contact with the variable resistance pattern.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory, may include: forming a stacked structure over a substrate, the stacked structure including a plurality of interlayer dielectric layers and a plurality of conductive layers which are alternately stacked; forming a first trench extended in a first direction by selectively etching the stacked structure, thereby separating the stacked structure into a first stacked structure at one side of the first trench and a second stacked structure at the other side of the first trench; forming a variable resistance pattern in the first trench; forming a second trench extended in the first direction by selectively etching the second stacked structure; filling the second trench with a conductive material; and forming a pillar-shaped second stacked structure pattern and a pillar-shaped conductive pattern by selectively etching the second stacked structure and the conductive material Implementations of the above method may include one or more of the following.

The forming of the variable resistance pattern comprises forming an oxygen-poor metal oxide layer contacted with one sidewall of the first trench and an oxygen-rich metal oxide layer contacted with the other sidewall of the first trench. The forming of the variable resistance pattern comprises: filling the first trench with the oxygen-poor metal oxide layer; and implanting oxygen into the oxygen-poor metal oxide layer using a mask which exposes a region where the oxygen-rich metal oxide layer is to be formed. The forming of the variable resistance pattern comprises: forming the oxygen-rich metal oxide layer on the entire surface of the resultant structure including the first trench; forming a gap-fill layer to fill the rest space of the first trench having the oxygen-rich metal oxide layer formed therein; etching a part of the gap-fill layer and a part of the oxygen-rich metal oxide layer using a mask pattern which exposes one sidewall of the first trench and covers the other sidewall of the first trench; removing the mask pattern and the gap-fill layer; and filling a space where the mask pattern and the gap-fill layer are removed with the oxygen-poor metal oxide layer. The forming of the variable resistance pattern comprises: forming an oxygen-rich metal oxide layer along the sidewalls and bottom of the first trench; and forming an oxygen-poor metal oxide layer to be buried in the first trench having the oxygen-rich metal oxide layer formed therein.

In these and other aspects, implementations and associated advantages are described in greater detail below in reference to the drawings.

DETAILED DESCRIPTION

Figure 1:
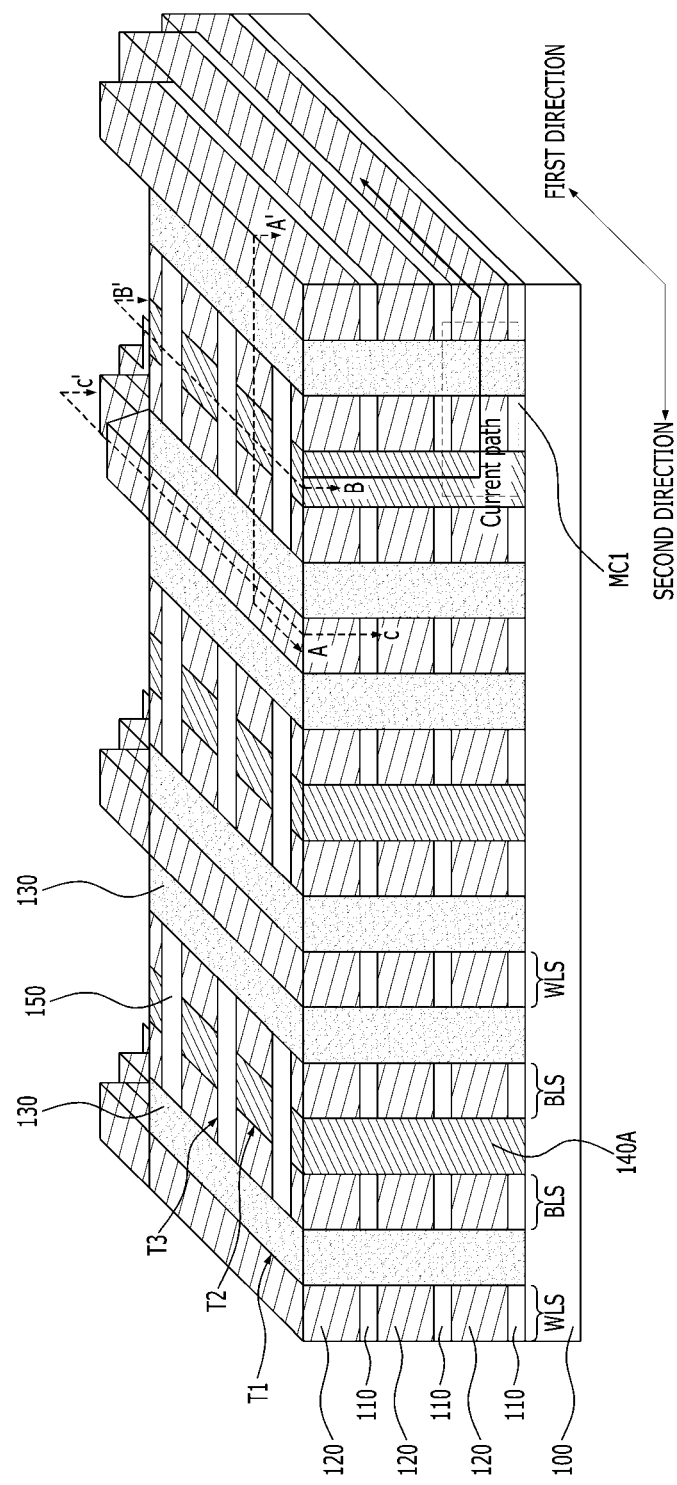
FIG. 1 is a perspective view of a semiconductor device in accordance with an implementation.

Various examples and implementations (or embodiments) are described below in detail with reference to the accompanying drawings.

The drawings may not be necessarily to scale and in some instances, proportions of at least some structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). For a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Hereafter, a semiconductor device and a method for fabricating the same in accordance with an implementation will be described with reference to FIGS. 1 to 6.

FIG. 1 is a perspective view of a semiconductor device in accordance with an implementation. FIGS. 2 to 6 are cross-sectional views for explaining a method for fabricating the semiconductor device of FIG. 1. In particular, FIGS. 2 to 6 are cross-sectional views taken along A-A' line, B-B' line, and/or C-C' line of FIG. 1.

Referring to FIG. 1, a variable resistance pattern 130 may be disposed over a substrate 100 so as to extend in a first direction parallel to an upper surface of the substrate 100 while protruding in a direction perpendicular to the upper surface of the substrate 100.

The variable resistance pattern 130 may be formed of a material which switches between different resistance states according to an applied voltage or current, and may have a monolayer or multilayer structure. For example, the variable resistance pattern 130 may be formed of a monolayer or multilayer including various materials used for RRAM, PRAM, MRAM, FRAM and the like, that is, a metal oxide such as transition metal oxide or perovskite-based oxide, a phase change material such as a chalcogenide material, a ferroelectric material, and a ferromagnetic material.

A stacked structure, in which a plurality of interlayer dielectric layers 110 and a plurality of conductive layers 120 are alternately stacked, may be disposed over the substrate 100 at both sides of the variable resistance pattern 130. For convenience of description, a stacked structure disposed at one side of the variable resistance pattern 130 is referred to as a first stacked structure WLS, and a stacked structure disposed at the other side of the variable resistance pattern 130 is referred to as a second stacked structure BLS.

The first and second stacked structures WLS and BLS may have different shapes from each other. The first stacked structure WLS may have a line shape extending in the first direction in a similar manner to the variable resistance pattern 130, when seen from the top. Thus, one side surface of the variable resistance pattern 130 may be contacted with one first stacked structure WLS. On the other hand, the second stacked structure BLS may have a pillar shape. Thus, the other side surface of the variable resistance pattern 130 may be contacted with one or more second stacked structures BLS which are arranged in the first direction so as to be spaced from each other.

In an implementation, one side and the other side may indicate that structures are positioned in the opposite sides of the variable resistance pattern 130. However, they may be arranged in different locations. When the surface of the variable resistance pattern 130, contacted with the first stacked structure WLS, is referred to as one surface, the surface of the variable resistance pattern 130, contacted with the second stacked structure BLS, may be referred to as the other surface. For example, between two neighboring variable resistance patterns 130 (e.g. where one of which is shown in FIG. 1), one located on the left side may be referred to as a first variable resistance pattern 130. Likewise, the other located on the right side may be referred to as a second variable resistance pattern 130, the left side surface of the first variable resistance pattern 130 may be referred to as one side surface, and the right side surface of the first variable resistance pattern 130 may be referred to as the other side surface. Furthermore, for the second variable resistance pattern 130, its left side surface may be referred to as the other side surface, and its right side surface may be referred to as one side surface.

In the first and second stacked structures WLS and BLS, the interlayer dielectric layer 110 may include oxide, nitride, or a combination thereof, and the conductive layer 120 may include metal, metal nitride, polysilicon doped with impurities, or various combinations.

When one side surface of the second stacked structure BLS is contacted with the variable resistance pattern 130, the other side surface of the second stacked structure BLS, positioned in the opposite side of the one side surface of the second stacked structure BLS, may be contacted with the pillar-shaped conductive pattern 140A. The other side surface or surfaces of one or more second stacked structures BLS arranged in the first direction may be contacted with one or more conductive patterns 140A arranged in the first direction, respectively. The conductive pattern 140A may include metal, metal nitride, polysilicon doped with impurities, or various combinations.

An insulating pattern 150 may extend from between the second stacked structures BLS arranged in the first direction to between the conductive patterns 140A arranged in the first direction, thereby separating the second stacked structures BLS adjacent in the first direction from each other and separating the conductive patterns 140A adjacent in the first direction from each other. The insulating pattern 150 may be formed of oxide, nitride, or a combination thereof.

One variable resistance pattern 130, one first stacked structure WLS, one second stacked structure BLS, and one conductive pattern 140A may form one memory block. A plurality of memory blocks may be arranged in the second direction. Furthermore, adjacent memory blocks may share the conductive pattern 140A and/or the first stacked structure WLS. In this case, the structures disposed at both sides of the conductive pattern 140A may be symmetrical to each other, and the structures disposed at both sides of the first stacked structure WLS may be symmetrical to each other. In an implementation, six variable resistance patterns 130, that is, six memory blocks may be disposed in the second direction. For convenience of description, the memory blocks are sequentially referred to as first to sixth memory blocks from the left side. At this time, the first and second memory blocks share the conductive pattern 140A. The third and fourth memory blocks share another conductive pattern. Likewise, the fifth and sixth memory blocks may share another conductive pattern. The second and third memory blocks may share the first stacked structure WLS. Likewise, the fourth and fifth memory blocks may share another first stacked structure WLS.

Furthermore, a portion of one variable resistance pattern 130, a portion of one conductive layer 120 of a first stacked structure WLS contacting with the portion of the variable resistance pattern 130, a portion of one conductive layer 120 of a second stacked structure BLS contacting with the portion of the variable resistance pattern 130, and a portion of one conductive pattern 140A contacting with the portion of the variable resistance pattern 130 through the portion of the conductive layer 120 of the second stacked structure BLS may form one memory cell. In other words, a memory cell may be formed at each of the intersections between the conductive layers 120 extended in the first direction parallel to the upper surface of the substrate 100 and the conductive patterns 140A extended in the direction perpendicular to the substrate 100. The conductive layer 120 of the first stacked structure WLS may function as a word line for controlling one end of the variable resistance element, the conductive pattern 140A may function as a bit line for controlling the other end of the variable resistance element, and the conductive layer 120 of the second stacked structure BLS may function as a kind of electrode contacted with the bit line. Referring to FIG. 1, a first memory cell MC1 may be formed at an intersection between a conductive pattern 140A located at the foremost position in the first direction among the conductive patterns 140 of the sixth memory block and the lowermost conductive layer 120 of the first stacked structure WLS. The first memory cell MC1 may be controlled according to a voltage applied through the conductive pattern 140A and the conductive layer 120. A current path passing through the first memory cell MC1 is indicated by a solid arrow.

An end part of the first stacked structure WLS in the first direction may have a step shape with respect to a neighboring stacked structure. The neighboring stacked structures are arranged in a top-bottom direction along the second direction. Specifically, each of the conductive layers 120 included in the first stacked structure WLS may extend further in the first direction than the neighboring conductive layer 120 positioned thereunder. In other words, each of the conductive layers 120 included in the first stacked structure WLS may have a portion protruding in the first direction further than another conductive layer 120 positioned thereunder. This is in order to provide contact areas (not illustrated) at the tops of the plurality of conductive layers 120. The contacts may be coupled to corresponding wirings. Voltages supplied through the wirings may be transferred to the respective conductive layers 120 of the first stacked structure WLS. Furthermore, a wiring (not illustrated) may be formed over the conductive pattern 140A. For example, a wiring may extend in the second direction while electrically coupled to the conductive pattern 140A. A voltage supplied through the wiring may be transferred to the conductive layer 120 of the second stacked structure BLS through the conductive pattern 140A.

One embodiment of a method for fabricating the above-described semiconductor device will be described as follows.

Figure 2:
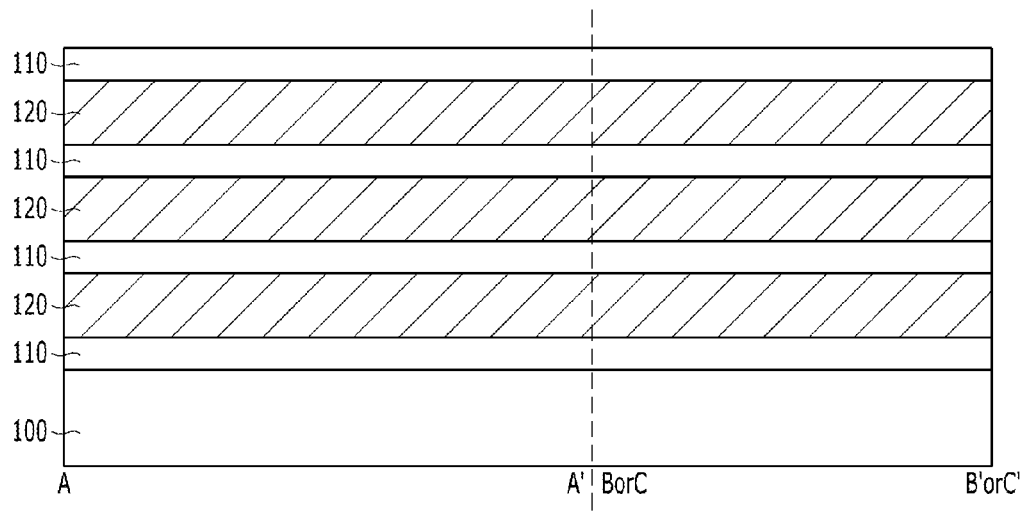
FIGS. 2 to 6 are cross-sectional views for explaining a method for fabricating the semiconductor device of FIG. 1.

Referring to FIG. 2, a stacked structure in which a plurality of interlayer dielectric layers 110 and a plurality of conductive layers 120 are alternately stacked may be formed over the substrate 100.

Figure 3:
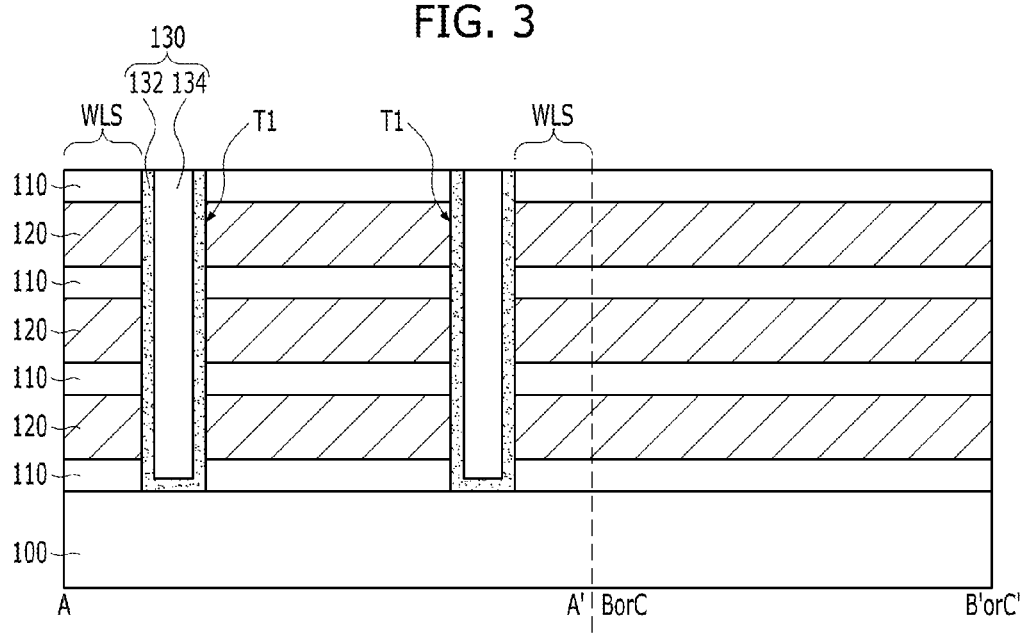

Referring to FIG. 3, the stacked structure of the plurality of interlayer dielectric layers 110 and the plurality of conductive layers 120 may be selectively etched to form a first trench T1 extended in the first direction within the stacked structure.

The first trench T1 may be filled with a variable resistance material to form a variable resistance pattern 130 which is extended in the first direction through the stacked structure. As described above, the variable resistance pattern 130 may be formed of a monolayer or multilayer including various materials having a variable resistance characteristic. The variable resistance pattern 130 may be formed by the following process. A variable resistance material is formed over the resultant structure having the first trench T1 formed therein. A planarization process, for example, a chemical mechanical polishing (CMP) process is performed to expose the uppermost interlayer dielectric layer 110.

In an implementation, the variable resistance pattern 130 may include an oxygen-rich metal oxide layer 132 and an oxygen-poor metal oxide layer 134. The oxygen-rich metal oxide layer 132 may include a layer which satisfies the stoichiometric ratio, such as $TiO_2$ or $Ta_2O_5$, and the oxygen-poor metal oxide layer 134 may include a layer of which the oxygen content is smaller than the stoichiometric ratio, such as $TiOx$ (x<2) or $TaOy$ (y<2.5). In this case, depending on factors such as, ● whether or not oxygen vacancies of the oxygen-poor metal oxide layer 134 are supplied to the oxygen-rich metal oxide layer 132 according to a voltage applied through the conductive layers 120 at both sides of the variable resistance pattern 130, and/or ● whether or not a filament current path is formed by the oxygen vacancies in the oxygen-rich metal oxide layer 132, the resistance of the memory cell may switch between a high resistance state and a low resistance state. In an implementation, the oxygen-rich metal oxide layer 132 is formed along sidewalls and a bottom of the first trench T1, and the oxygen-poor metal oxide layer 134 is formed to fill the first trench T1 having the oxygen-rich metal oxide layer 132 formed therein. However, implementations are not limited thereto. As described below with reference to FIG. 7, the shapes of the oxygen-rich metal oxide layer 132 and the oxygen-poor metal oxide layer 134 may vary. The variable resistance pattern 130 may be formed by the following process: the oxygen-rich metal oxide layer 132 is formed along the entire surface of the resultant structure having the trench T1 formed therein; the oxygen-poor metal oxide layer 134 is formed over the oxygen-rich metal oxide layer 132 to such a thickness as to sufficiently fill the first trench T1; and a planarization process is performed until the uppermost interlayer dielectric layer 110 is exposed.

The stacked structure may be divided into a stacked structure disposed at a first side of the variable resistance pattern 130 and another stacked structure disposed at the other side of the variable resistance pattern 130. As a result, the first stacked structure WLS may be defined at the first side of the variable resistance pattern 130. However, the second stacked structure BLS may not yet be defined.

Figure 4:
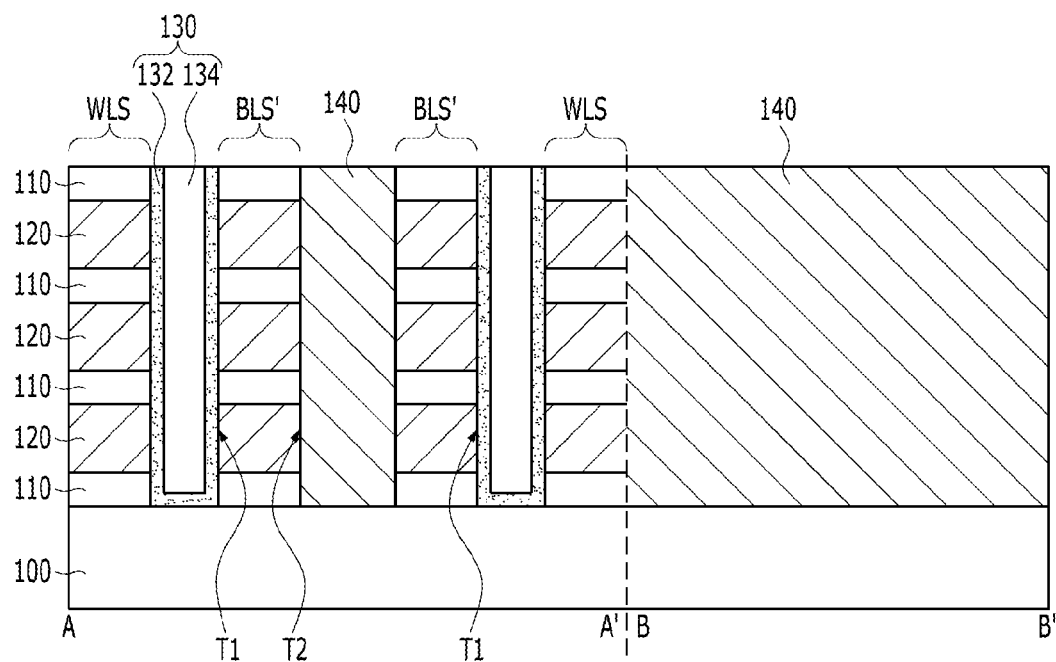

Referring to FIG. 4, the stacked structure at the second side of the variable resistance pattern 130 may be selectively etched to form a second trench T2 extended in the first direction within the stacked structure. The stacked structure at the second side of the variable resistance pattern 130 may be separated into a stacked structure at a first side of the second trench T2 and a stacked structure at a second side of the second trench T2 by the second trench T2. The stacked structures at the first side and the second side of the second trench T2 may be referred to as early second stacked structures BLS'. The early second stacked structures BLS' may be extended in the first direction.

The second trench T2 may be filled with a conductive material to form an early conductive pattern 140 which is extended in the first direction.

Figure 5:
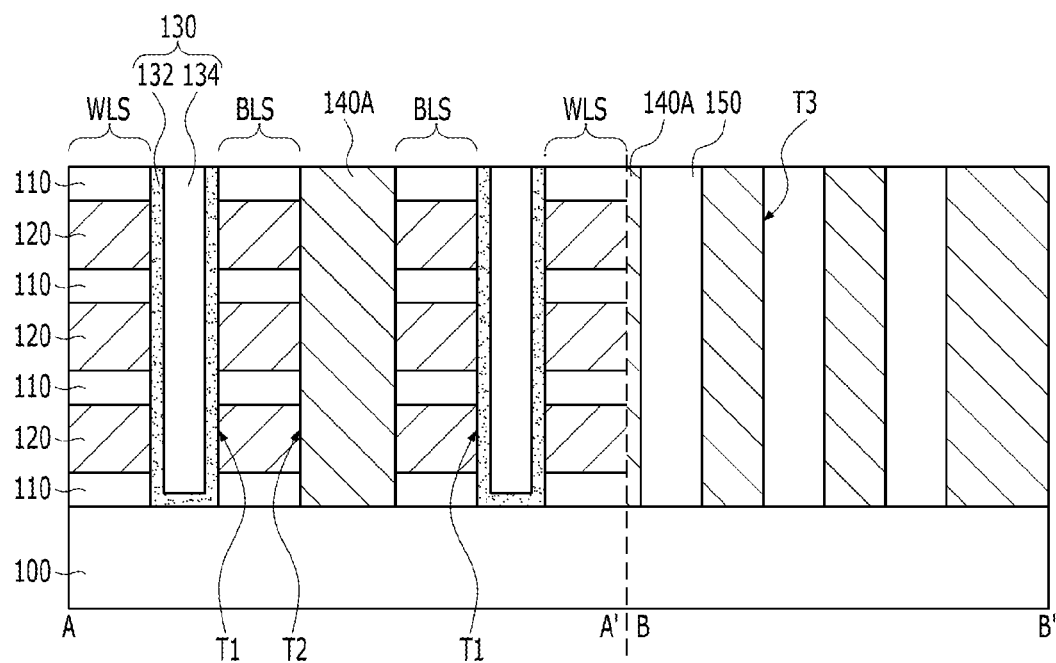

Referring to FIG. 5, the early second stacked structure BLS' and the early conductive pattern 140 may be selectively etched to form a third trench T3 which separates the early second stacked structure BLS' and the early conductive pattern 140 into two or more structures and patterns arranged in the first direction. As the third trench T3 is formed, the early second stacked structure BLS' may be changed into the second stacked structure BLS, and the early conductive pattern 140 may be changed into the conductive pattern 140A.

The third trench T3 may be filled with an insulating material to form an insulating pattern 150.

Figure 6:
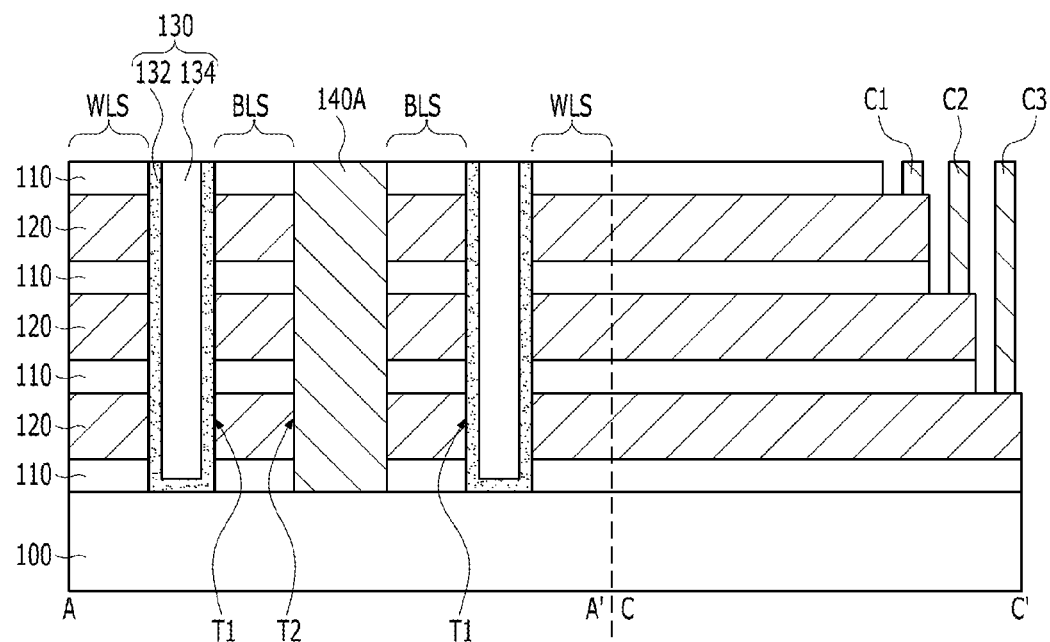

Referring to FIG. 6, an end part of the first stacked structure extending in the first direction may be selectively etched so as to have a step shape. Since this process may employ a well-known patterning method, the detailed descriptions thereof are omitted herein. In a pair of conductive layers 120 arranged in a top-bottom direction, a bottom conductive layer 120 of the first stacked structure WLS may have a portion extending further than a top conductive layer 120.

Then, conductive contacts C1, C2, and C3 may be formed over the protruding portions (or end portions) of the respective conductive layers 120 of the first stacked structure WLS. The conductive contacts C1, C2, and C3 may be formed by the following process: an insulating layer (not illustrated) is formed to cover the first stacked structure WLS and selectively etched to form holes which expose the respective protruding portions of the conductive layers 120; and a conductive layer fills in the holes.

Although not specifically illustrated, wirings may be formed over the insulating layer covering the first stacked structure WLS and coupled to the respective conductive contacts C1, C2, and C3. Furthermore, although also not specifically illustrated, a conductive material may be deposited on the resultant structure of FIG. 6 and then patterned to form a wiring to be coupled to the conductive pattern 140A.

The semiconductor device and the method for fabricating the same in accordance with the certain embodiments can provide one or more of the following benefits.

One possible benefit is that since a plurality of memory cells are stacked in a vertical direction over the substrate 100, an integration degree of the semiconductor device may be increased.

Another possible benefit is that a fabrication process may be easily performed, and a process defect can be reduced. For example, in a conventional semiconductor device having a variable resistance material interposed between a horizontal wiring and a vertical wiring, the variable resistance material may be deposited on a sidewall of a vertical hole, and the vertical hole may be filled with a conductive material to form the vertical wiring. At this time, when the conductive material fills the vertical hole, the characteristic of the previously-deposited variable resistance material may be degraded. According to an implementation of a particular embodiment, however, since the variable resistance material fills in the line-shaped trench and the previously-formed conductive layers 120 are disposed at both sides of the trench, the characteristic of the variable resistance material can be maintained. Furthermore, since the variable resistance pattern 130 may be formed in a line shape, the fabrication process may be performed more easily and precisely than when the variable resistance material is patterned in a hole shape. In addition, since the variable resistance material fills in the trench, a thickness of the variable resistance material may be maintained uniform in the horizontal direction. Thus, the characteristic of the variable resistance material may be improved.

Another possible benefit is that a fabrication cost may be reduced. That is, since the plurality of variable resistance patterns 130 or the plurality of conductive layers 120 may be collectively formed, the number of processes may be reduced.

Another possible benefit is that a plurality of memory blocks (each including a plurality of memory cells), may be arranged in a direction parallel to an upper surface of the substrate 100. Since the memory blocks may share the conductive layer 120 of the first stacked structure WLS functioning as a word line and/or the conductive pattern 140A functioning as a bit line, an area occupied by a unit cell of the device may be reduced. Furthermore, since the structures formed at both sides of the conductive layer 120 and/or the conductive pattern 140A of the first stacked structure WLS are symmetrical with each other, it is possible to secure uniformity in characteristics of the memory cells.

Hereafter, referring to FIGS. 7 to 11, a semiconductor device and a method for fabricating the same in accordance with an implementation will be described. The following descriptions will be focused on differences from the above-described implementation.

Figure 7:
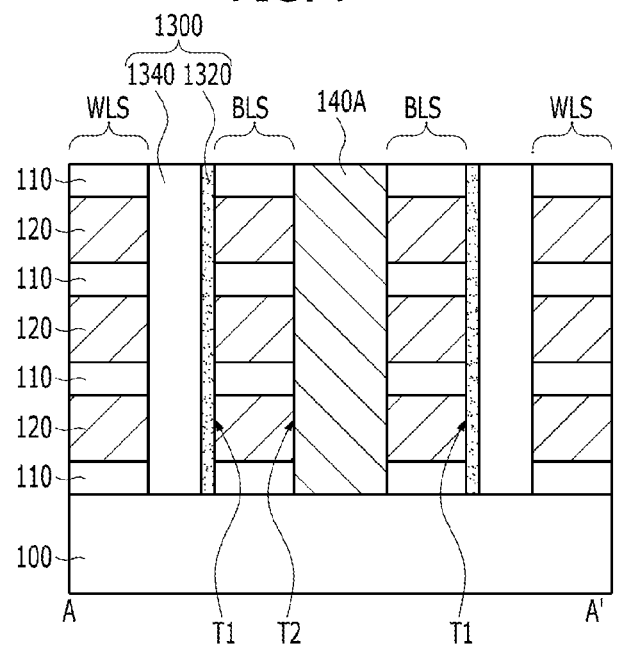
FIG. 7 is a cross-sectional view of a semiconductor device in accordance with an implementation.
Figure 8:
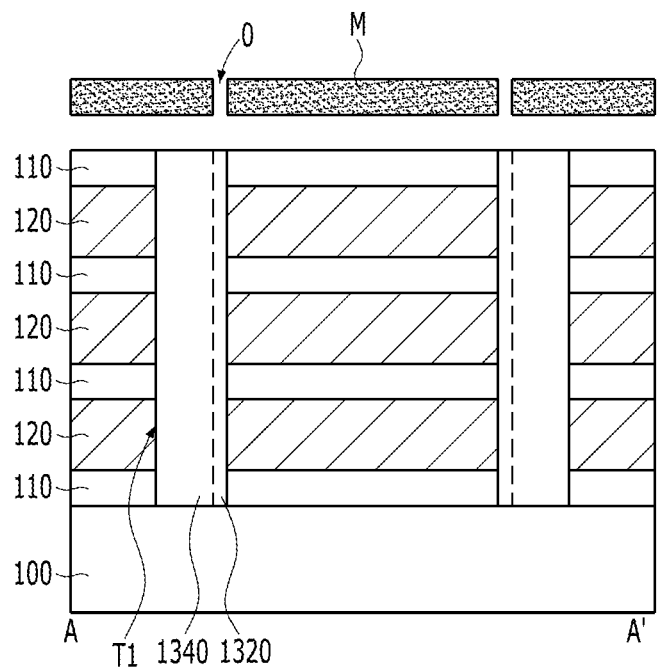
FIG. 8 is a cross-sectional view for explaining a method for fabricating the semiconductor device of FIG. 7.
Figure 9:
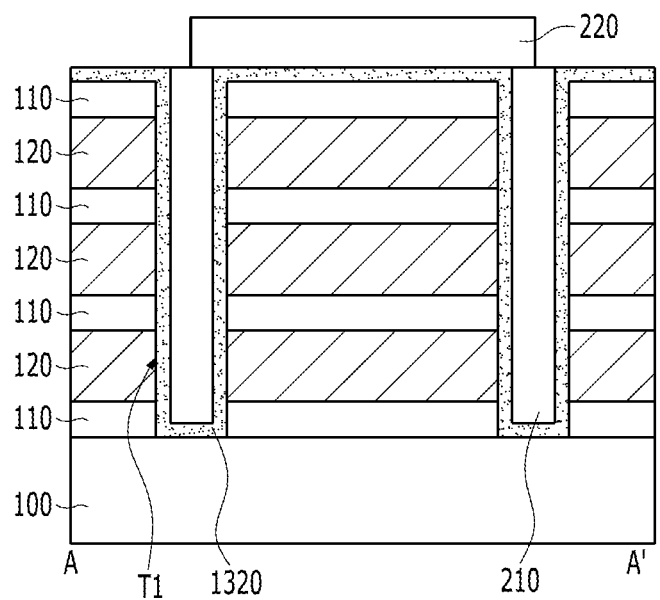
FIGS. 9 to 11 are cross-sectional views for explaining another method for fabricating the semiconductor device of FIG. 7.
Figure 10:
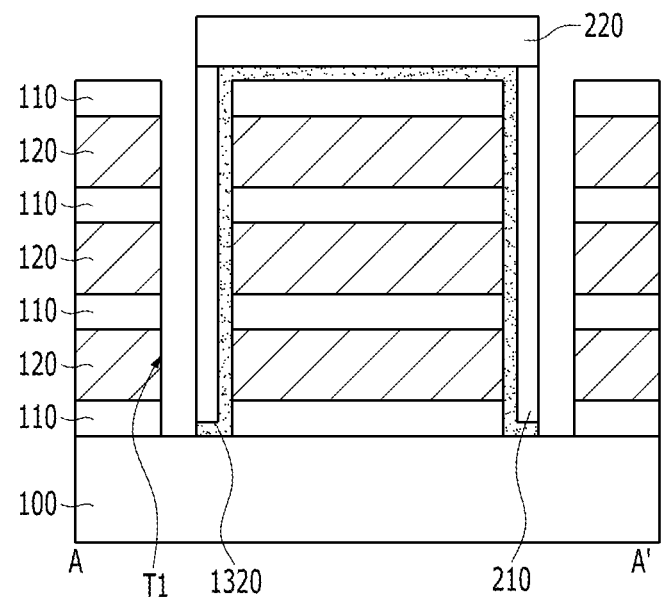
Figure 11:
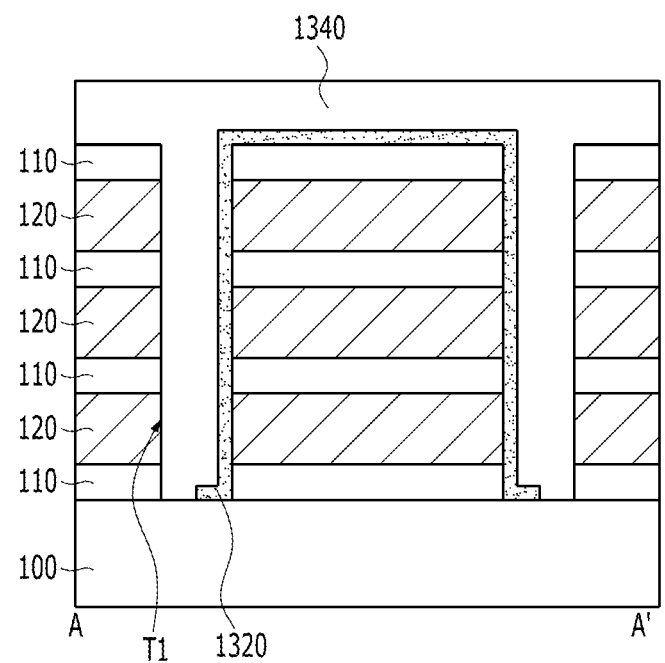

FIG. 7 is a cross-sectional view of a semiconductor device in accordance with an implementation. FIG. 8 is a cross-sectional view for explaining a method for fabricating the semiconductor device of FIG. 7. FIGS. 9 to 11 are cross-sectional views for explaining another method for fabricating the semiconductor device of FIG. 7.

Referring to FIG. 7, a variable resistance pattern 1300 may include an oxygen-rich metal oxide layer 1320 and an oxygen-poor metal oxide layer 1340. The oxygen-rich metal oxide layer 1320 may be extended in the first direction while disposed on one sidewall of the first trench T1, and the oxygen-poor metal oxide layer 1340 may be extended in the first direction while disposed on another sidewall of the first trench T1. In other words, each of the oxygen-rich metal oxide layer 1320 and the oxygen-poor metal oxide layer 1340 may be contacted with the first or the second stacked structures WLS and BLS. For example, when the oxygen-rich metal oxide layer 1320 contacts the second stacked structure BLS, the oxygen-poor metal oxide layer 1340 may be contacted with the first stacked structure WLS.

Under this structure, since oxygen vacancies may be easily transferred from the oxygen-poor metal oxide layer 1340 to the oxygen-rich metal oxide layer 1320, the operation characteristic may be improved.

The variable resistance pattern 1300 of the semiconductor device of FIG. 7 may be fabricated through a method described with reference to FIG. 8.

Referring to FIG. 8, the stacked structure of the interlayer dielectric layers 110 and the conductive layers 120 may be etched to form a first trench T1, and the first trench T1 may be filled with an oxygen-poor metal oxide layer 1340.

A mask pattern M having an opening O to expose a region where the oxygen-rich metal oxide layer 1320 is to be formed may be formed over the stacked structure, and oxygen implant may be performed. The oxygen implant may be performed through gas cluster ion beams. In this case, oxygen is implanted into a part of the oxygen-poor metal oxide layer 1340 through the opening O, and converts the region subject to the oxygen implantation into an oxygen-rich metal oxide layer 1320.

As a result, the variable resistance pattern 1300 similar to that of FIG. 7 may be formed.

The variable resistance pattern 1300 of the semiconductor device of FIG. 7 may be fabricated through a method described with reference to FIGS. 9 to 11.

Referring to FIG. 9, the stacked structure of the interlayer dielectric layers 110 and the conductive layers 120 may be etched to form a first trench T1, and the oxygen-rich metal oxide layer 1320 may be formed as a liner along the first trench T1 and over surface of the resultant structure.

Then, a gap-fill layer 210 may be formed to fill the first trench T1 having the oxygen-rich metal oxide layer 1320. The gap-fill layer 210 may be formed of a material which is easily removed and/or which has an excellent burial characteristic, for example, spin-on-carbon (SOC).

A mask pattern 220 may be formed so as to partially expose the gap-fill layer 210 in the first trench T1. For example, the mask pattern 220 may have a shape to partially cover two adjacent first trenches T1. The mask pattern 220 may include a photoresist pattern, but is not limited thereto.

Referring to FIG. 10, the mask pattern 220 may be used as an etch barrier to etch the gap-fill layer 210 and the oxygen-rich metal oxide layer 1320. Thus, the oxygen-rich metal oxide layer 1320 may be left only on the one sidewall of the first trench T1, and the oxygen-rich metal oxide layer 1320 over the other sidewall of the first trench T1 is removed.

Referring to FIG. 11, the mask pattern 220 and the gap-fill layer 210 are removed. When the mask pattern 220 and the gap-fill layer 210 are formed of the same kind of material, the mask pattern 220 and the gap-fill layer 210 may be removed at the same time. For example, when the mask pattern 220 is formed of photoresist and the gap-fill layer 210 is formed of a carbon-based material such as SOC, the mask pattern 220 and the gap-fill layer 210 may be removed through an oxygen strip process.

The oxygen-poor metal oxide layer 1340 may be formed to fill the first trench T1.

Although not illustrated, a planarization process is performed to expose the uppermost interlayer dielectric layer 110. As a result, the variable resistance pattern 1300 similar to that of FIG. 7 may be formed.

In accordance with embodiments, it is possible to increase an integration degree, improve the performance characteristic, and simplify a fabrication process.

Memory circuits or semiconductor devices employing particular embodiments can be used in a variety of devices or systems. FIGS. 12-16 provide some examples of such devices or systems that can implement the memory circuits according to certain embodiments.

Figure 12:
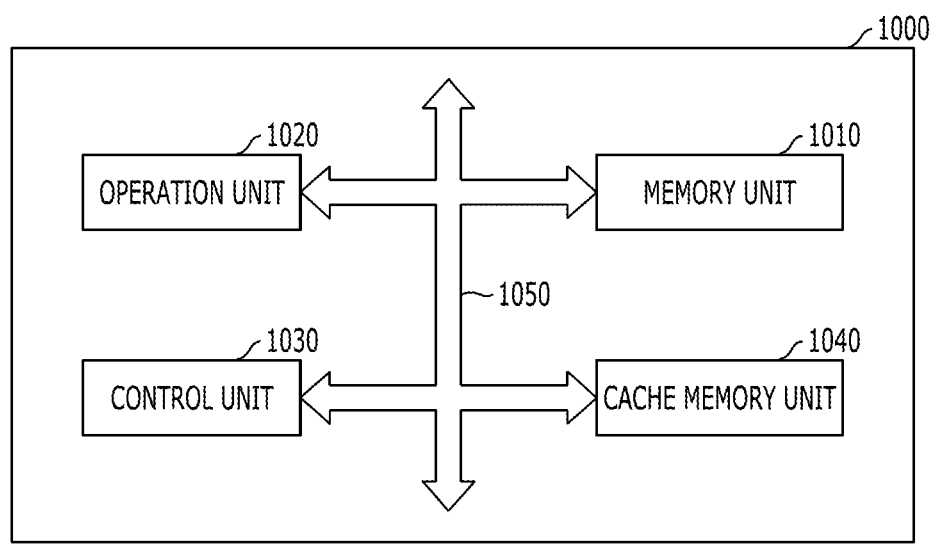
FIG. 12 is an example of configuration diagram of a microprocessor implementing memory circuitry according to an embodiment.

FIG. 12 is an example of configuration diagram of a microprocessor implementing memory circuitry.

Referring to FIG. 12, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 stores data in the microprocessor 1000 serving as a processor register, a register, or the like. The memory unit 1010 may include a data register, an address register, a floating point register, and so on. Besides, the memory unit 1010 may include various registers. The memory unit 1010 may perform the function of temporarily storing, data for which operations are to be performed by the operation unit 1020, result data of performing the operations, and/or addresses designating a location where data for performing of the operations are stored.

The memory unit 1010 may include one or more of the above-described semiconductor devices in accordance with embodiments. For example, the memory unit 1010 may include a first structure comprising a plurality of interlayer dielectric layers and a plurality of conductive layers which are alternately stacked over the substrate, and coupled to a first side surface of the variable resistance pattern, wherein the first structure has a line shape extending in the first direction; a second structure comprising the plurality of interlayer dielectric layers and the plurality of conductive layers which are alternately stacked over the substrate, wherein a first side surface of the second structure is coupled to a second side surface of the variable resistance pattern, wherein the second structure has a pillar shape; and a pillar-shaped conductive pattern coupled to a second side surface of the second structure. According to such a structure, an integration degree of the memory unit 1010 may be increased, and data storage characteristics of the memory unit 1010 may be improved. As a consequence, a size of the microprocessor 1000 may be reduced, and operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to an implementation may additionally include a cache memory unit 1040 which can temporarily store data to be inputted from an external device other than the memory unit 1010 or to be outputted to an external device. In such an embodiment, the cache memory unit 1040 may exchange data with the memory unit 1010, the operation unit 1020 and the control unit 1030 through a bus interface 1050.

Figure 13:
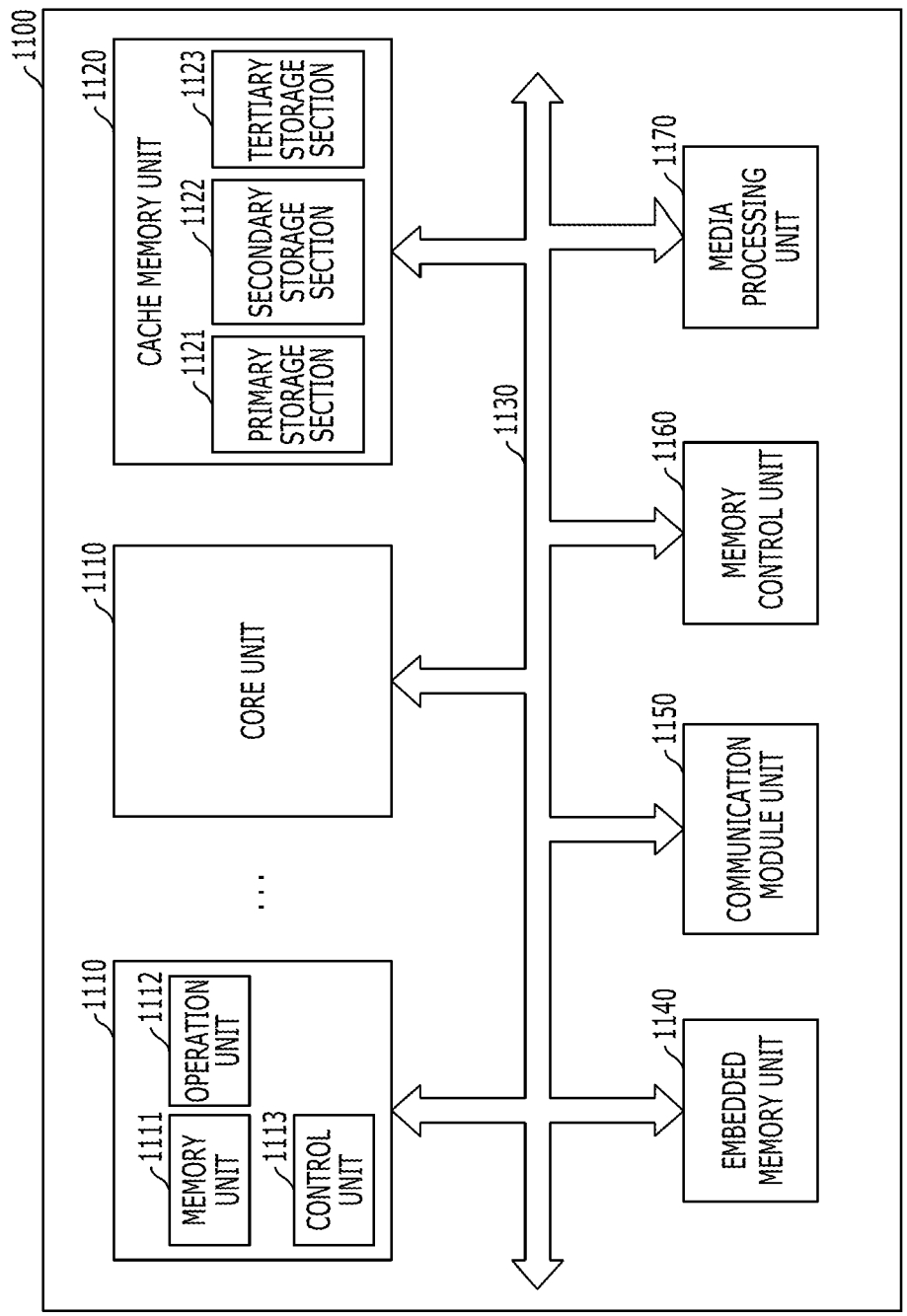
FIG. 13 is an example of configuration diagram of a processor implementing memory circuitry according to an embodiment.

FIG. 13 is an example of configuration diagram of a processor implementing memory circuitry according to an embodiment.

Referring to FIG. 13, a processor 1100 may improve performance and realize multi-functionality by including various functions in addition to those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 may store data in the processor 1100 serving as a processor register, a register, or the like. The memory unit 1111 may include a data register, an address register, a floating point register and so on. Besides, the memory unit 1111 may include various registers. The memory unit 1111 may perform the function of temporarily storing data necessary for operations of the operation unit 1112, result data of performing the operations and addresses designating a location where data for performing of the operations are stored. The operation unit 1112 may perform operations in the processor 1100. The operation unit 1112 may perform four arithmetical operations, logical operations, according to results obtained when the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 may temporarily store data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. When appropriate, the cache memory unit 1120 may include an increased number of storage sections. That is, the number of storage sections which are included in the cache memory unit 1120 may vary according to a design. The speeds at which the primary, secondary and tertiary storage sections 1121, 1122 and 1123 store data may be the same or different. In the case where the speeds of the respective storage sections 1121, 1122 and 1123 are different, the speed of the primary storage section 1121 may be fastest. At least one storage section of the primary storage section 1121, the secondary storage section 1122 and the tertiary storage section 1123 of the cache memory unit 1120 may include one or more of the above-described semiconductor devices in accordance with embodiments. For example, the cache memory unit 1120 may include a first structure comprising a plurality of interlayer dielectric layers and a plurality of conductive layers which are alternately stacked over the substrate, and coupled to a first side surface of the variable resistance pattern, wherein the first structure has a line shape extending in the first direction; a second structure comprising the plurality of interlayer dielectric layers and the plurality of conductive layers which are alternately stacked over the substrate, wherein a first side surface of the second structure is coupled to a second side surface of the variable resistance pattern, wherein the second structure has a pillar shape; and a pillar-shaped conductive pattern coupled to a second side surface of the second structure. Under this structure, an integration degree of the cache memory unit 1120 may be increased, and data storage characteristics of the cache memory unit 1120 may be improved. As a consequence, a size of the processor 1100 may be reduced, and operating characteristics of the processor 1100 may be improved.

Although it was shown in FIG. 13 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 may connect the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be faster than the processing speeds of the secondary and tertiary storage sections 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to an implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. The processor 1100 may also include a plurality of various modules and devices. In this case, the plurality of modules may exchange data with the core units 1110 and the cache memory unit 1120, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 may administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process data processed in the processor 1100 or data inputted in the forms of image, voice, and the like from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 14:
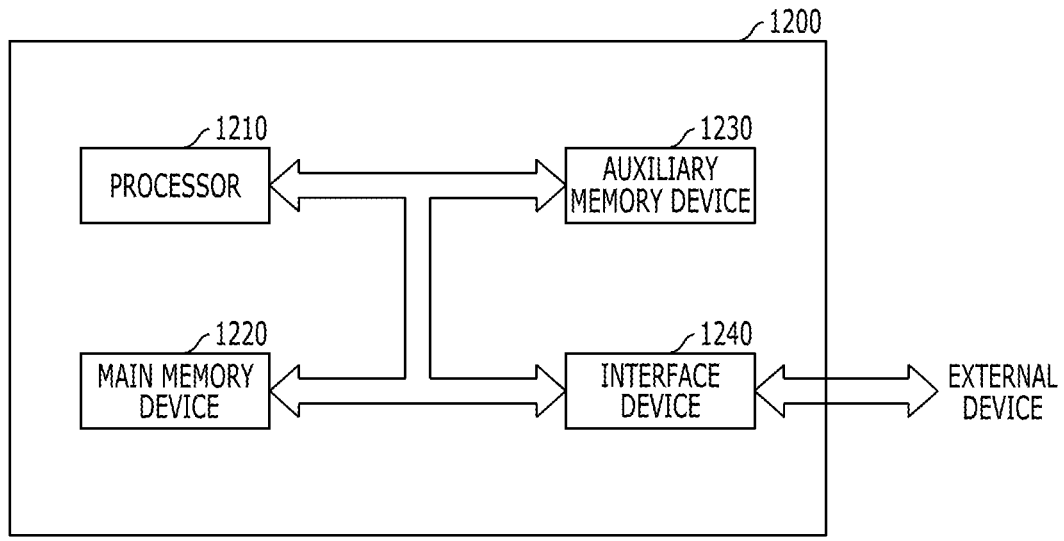
FIG. 14 is an example of configuration diagram of a system implementing memory circuitry according to an embodiment.

FIG. 14 is an example of configuration diagram of a system implementing memory circuitry according to an embodiment.

Referring to FIG. 14, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of an implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more semiconductor devices in accordance with an implementation. For example, the main memory device 1220 may include a first structure comprising a plurality of interlayer dielectric layers and a plurality of conductive layers which are alternately stacked over the substrate, and coupled to a first side surface of the variable resistance pattern, wherein the first structure has a line shape extending in the first direction; a second structure comprising the plurality of interlayer dielectric layers and the plurality of conductive layers which are alternately stacked over the substrate, wherein a first side surface of the second structure is coupled to a second side surface of the variable resistance pattern, wherein the second structure has a pillar shape; and a pillar-shaped conductive pattern coupled to a second side surface of the second structure. Under this structure, an integration degree of the main memory device 1220 may be increased, and data storage characteristics of the main memory device 1220 may be improved. As a consequence, a size of the system 1200 may be reduced and operating characteristics of the system 1200 may be improved.

Also, the main memory device 1220 may further include a static random access memory (SRAM), a dynamic random access memory (DRAM), and so on, which are volatile memory devices in which all contents are erased when power supply is cut off. Unlike this, the main memory device 1220 may include a non-volatile memory rather than a volatile memory such as a static random access memory (SRAM), a dynamic random access memory (DRAM), and so on.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with an implementation. For example, the auxiliary memory device 1230 may include a first structure comprising a plurality of interlayer dielectric layers and a plurality of conductive layers which are alternately stacked over the substrate, and coupled to a first side surface of the variable resistance pattern, wherein the first structure has a line shape extending in the first direction; a second structure comprising the plurality of interlayer dielectric layers and the plurality of conductive layers which are alternately stacked over the substrate, wherein a first side surface of the second structure is coupled to a second side surface of the variable resistance pattern, wherein the second structure has a pillar shape; and a pillar-shaped conductive pattern coupled to a second side surface of the second structure. Through this, integration degree of the auxiliary memory device 1230 may be increased, and data storage characteristics of the auxiliary memory device 1230 may be improved. As a consequence, a size of the system 1200 may be reduced and operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to an implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may perform an exchange of commands and data between the system 1200 according to an implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network, or both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 15:
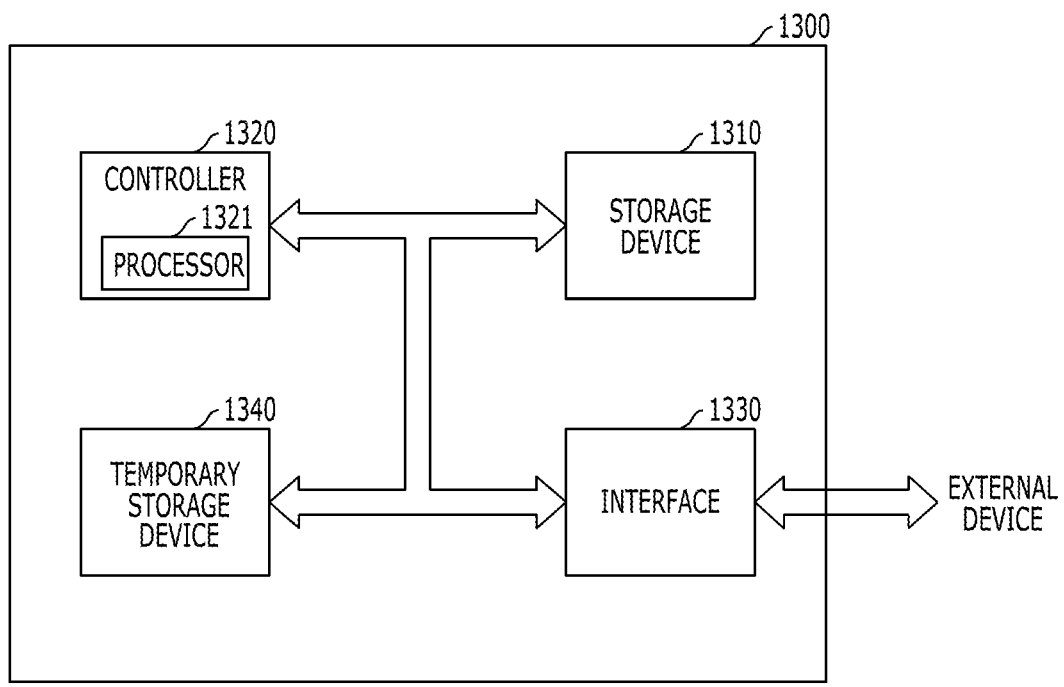
FIG. 15 is an example of configuration diagram of a data storage system implementing memory circuitry according to an embodiment.

FIG. 15 is an example of configuration diagram of a data storage system implementing memory circuitry according to an embodiment.

Referring to FIG. 15, a data storage system 1300 may include a storage device 1310 which has a data storage component with a nonvolatile characteristic, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control an exchange of data between the storage device 1310 and the interface 1330. To this end, the controller 1320 may include a processor 1321 for performing an operation, processing commands inputted through the interface 1330 from an outside of the data storage system 1300 and so on.

The interface 1330 is to perform an exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with an implementation. The temporary storage device 1340 may include a first structure comprising a plurality of interlayer dielectric layers and a plurality of conductive layers which are alternately stacked over the substrate, and coupled to a first side surface of the variable resistance pattern, wherein the first structure has a line shape extending in the first direction; a second structure comprising the plurality of interlayer dielectric layers and the plurality of conductive layers which are alternately stacked over the substrate, wherein a first side surface of the second structure is coupled to a second side surface of the variable resistance pattern, wherein the second structure has a pillar shape; and a pillar-shaped conductive pattern coupled to a second side surface of the second structure. Through this, integration degree of the temporary storage device 1340 may be increase, and data storage characteristics of the temporary storage device 1340 may be improved. As a consequence, a size of the data storage system 1300 may be reduced and operating characteristics of the data storage system 1300 may be improved.

Figure 16:
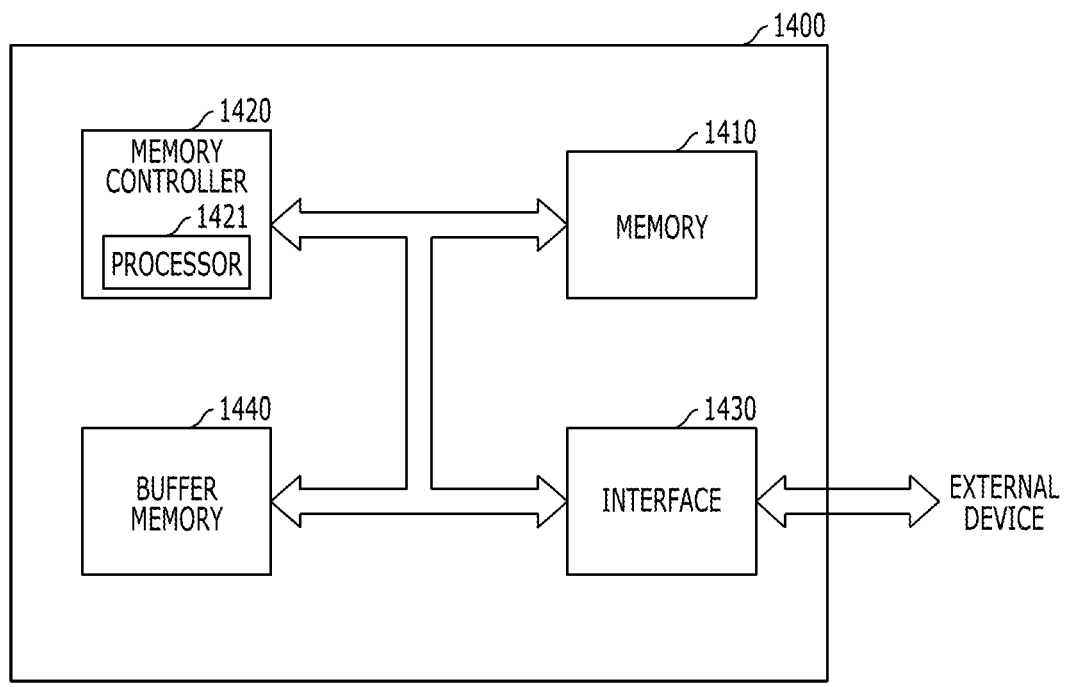
FIG. 16 is an example of configuration diagram of a memory system implementing memory circuitry according to an embodiment.

FIG. 16 is an example of configuration diagram of a memory system implementing memory circuitry according to an embodiment.

Referring to FIG. 16, a memory system 1400 may include a memory 1410 which has a data storage component with a nonvolatile characteristic, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with an implementation. For example, the memory 1410 may include a first structure comprising a plurality of interlayer dielectric layers and a plurality of conductive layers which are alternately stacked over the substrate, and coupled to a first side surface of the variable resistance pattern, wherein the first structure has a line shape extending in the first direction; a second structure comprising the plurality of interlayer dielectric layers and the plurality of conductive layers which are alternately stacked over the substrate, wherein a first side surface of the second structure is coupled to a second side surface of the variable resistance pattern, wherein the second structure has a pillar shape; and a pillar-shaped conductive pattern coupled to a second side surface of the second structure. Through this, integration degree of the memory 1410 may be increased, and data storage characteristics of the memory 1410 may be improved. As a consequence, a size of the memory system 1400 may be reduced and operating characteristics of the memory system 1400 may be improved.

Also, the memory 1410 according to an implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control an exchange of data between the memory 1410 and the interface 1430. To this end, the memory controller 1420 may include a processor 1421 for performing an operation and processing commands inputted through the interface 1430 from an outside of the memory system 1400.

The interface 1430 may perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having different types from each other.

The memory system 1400 according to an implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with an implementation. The buffer memory 1440 may include a first structure comprising a plurality of interlayer dielectric layers and a plurality of conductive layers which are alternately stacked over the substrate, and coupled to a first side surface of the variable resistance pattern, wherein the first structure has a line shape extending in the first direction; a second structure comprising the plurality of interlayer dielectric layers and the plurality of conductive layers which are alternately stacked over the substrate, wherein a first side surface of the second structure is coupled to a second side surface of the variable resistance pattern, wherein the second structure has a pillar shape; and a pillar-shaped conductive pattern coupled to a second side surface of the second structure. Through this, integration degree of the buffer memory 1440 may be increased, and data storage characteristics of the buffer memory 1440 may be improved. As a consequence, a size of the memory system 1400 may be reduced and operating characteristics of the memory system 1400 may be improved.

Moreover, the buffer memory 1440 according to an implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with an implementation, patterning of a resistance variable element is easy, and it is possible to secure the characteristics of the resistance variable element.

Features in the above examples of electronic devices or systems in FIGS. 12-16 employing a memory device according to an embodiment may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While the above description provides certain specifics, these should be construed as illustrative rather than limiting.

Certain features that are described above can also be implemented by employing a single embodiment. Various features described above can also be implemented by combining multiple embodiments or a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments should not be understood as requiring such separation in all embodiments.

Only a few implementations and examples are described herein. Other implementations, enhancements and variations can be made.

What is claimed is:

1. An electronic device comprising a semiconductor memory,
   wherein the semiconductor memory comprises:
   a variable resistance pattern disposed over a substrate and extending in a first direction, the variable resistance pattern having a first side surface and a second side surface opposite to the first side surface in a second direction that crosses the first direction;
   a first structure comprising a plurality of interlayer dielectric layers and a plurality of conductive layers which are alternately stacked over the substrate, the first structure being coupled to the first side surface of the variable resistance pattern, wherein the first structure has a line shape extending in the first direction;
   a second structure comprising the plurality of interlayer dielectric layers and the plurality of conductive layers which are alternately stacked over the substrate, the second structure having a first side surface coupled to the second side surface of the variable resistance pattern, wherein the second structure has a pillar shape; and
   a pillar-shaped conductive pattern coupled to a second side surface of the second structure,
   wherein the second side surface of the second structure is opposite to the first side surface of the second structure in the second direction, the second structure being disposed between the pillar-shaped conductive pattern and the variable resistance pattern.

2. The electronic device of claim 1, wherein the second structure and a plurality of neighboring second structures are arranged in the first direction so that two neighboring second structures of the second structure and the plurality of neighboring second structures are spaced from each other, and
   wherein a plurality of neighboring conductive patterns are coupled to second side surfaces of the plurality of neighboring second structures, respectively.

3. The electronic device of claim 2, further comprising an insulating pattern disposed between two neighboring second structures of the second structure and the plurality of neighboring second structures, and disposed between two neighboring conductive patterns of the pillar-shaped conductive pattern and the plurality of neighboring conductive patterns.

4. The electronic device of claim 1, wherein a unit memory cell is disposed at an intersection between one of the plurality of conductive layers of the first structure and the pillar-shaped conductive pattern.

5. The electronic device of claim 1, wherein the variable resistance pattern has multiple resistance states, and
   wherein a resistance value of the variable resistance pattern is changeable between the multiple resistance states according to a voltage or current applied through the conductive layers of the first structure and the second structure.

6. The electronic device of claim 1, wherein the variable resistance pattern comprises a metal oxide, a phase change material, a ferroelectric material, or a ferromagnetic material.

7. The electronic device of claim 1, wherein the variable resistance pattern comprises an oxygen-poor metal oxide layer and an oxygen-rich metal oxide layer, and
wherein the oxygen-poor metal oxide layer is coupled to the first structure, and the oxygen-rich metal oxide layer is coupled to the second structure.

8. The electronic device of claim 1, wherein the variable resistance pattern comprises an oxygen-poor metal oxide layer and an oxygen-rich metal oxide layer,
wherein the oxygen-poor metal oxide layer has a line shape extending in the first direction, and
wherein the oxygen-rich metal oxide layer has a shape that surrounds sidewalls and a bottom of the oxygen-poor metal oxide layer, and is coupled to the first and second structures.

9. The electronic device of claim 1, wherein an end portion of the first structure extending in the first direction has a step shape.

10. The electronic device of claim 1, wherein the pillar-shaped conductive pattern, the second structure, the variable resistance pattern, and the first structure are sequentially arranged in the second direction, and
wherein the pillar-shaped conductive pattern, another second structure, another variable resistance pattern, and another first structure are sequentially arranged in a reverse direction of the second direction.

11. The electronic device of claim 1, wherein the first structure, the variable resistance pattern, the second structure, and the pillar-shaped conductive pattern are sequentially arranged in the second direction, and
wherein the first structure, another variable resistance pattern, another second structure, and another pillar-shaped conductive pattern are sequentially arranged in a reverse direction of the second direction.

12. The electronic device according to claim 1, further comprising a microprocessor which includes:
a control unit configured to receive a signal including a command from an outside of the microprocessor, and perform extracting, decoding of the command, or controlling input or output of a signal of the microprocessor;
an operation unit configured to perform an operation based on a result from the control unit, wherein the result is obtained by decoding the command; and
a memory unit configured to store first data necessary for performing the operation, second data generated by performing the given operation, or addresses of the first and the second data,
wherein the semiconductor memory is part of the memory unit in the microprocessor.

13. The electronic device according to claim 1, further comprising a processor which includes:
a core unit configured to perform, in response to a command inputted from an outside of the processor, a first operation using first data;
a cache memory unit configured to store second data for performing the operation, third data obtained from the first operation, or addresses of the first, the second, and the third data; and
a bus interface connected between the core unit and the cache memory unit, and configured to transmit data between the core unit and the cache memory unit,
wherein the semiconductor memory is part of the cache memory unit in the processor.

14. The electronic device according to claim 1, further comprising a processing system which includes:
a processor configured to decode a command received by the processor and control a first operation for information in response to a decoded command;
an auxiliary memory device configured to store a program for decoding the command and the information;
a main memory device configured to call and store the program and the information from the auxiliary memory device, wherein the processor is configured to perform the first operation using the program and the information by executing the program; and
an interface device configured to perform communication between the outside and at least one of the processor, the auxiliary memory device, the main memory device, and a combination,
wherein the semiconductor memory is part of the auxiliary memory device or the main memory device in the processing system.

15. The electronic device according to claim 1, further comprising a data storage system which includes:
a storage device configured to store first data and retain the first data regardless of power supply;
a controller configured to control input and output of second data to and from the storage device according to a command inputted from an outside;
a temporary storage device configured to temporarily store third data exchanged between the storage device and the outside; and
an interface configured to perform communication between the outside and at least one of the storage device, the controller, the temporary storage device, and a combination thereof,
wherein the semiconductor memory is part of the storage device or the temporary storage device in the data storage system.

16. The electronic device according to claim 1, further comprising a memory system which includes:
a memory configured to store first data and retain the first data regardless of power supply;
a memory controller configured to control input and output of second data to and from the memory according to a command inputted from an outside;
a buffer memory configured to buffer data exchanged between the memory and the outside; and
an interface configured to perform communication between the outside and at least one of the memory, the memory controller, the buffer memory, and a combination thereof,
wherein the semiconductor memory is part of the memory or the buffer memory in the memory system.

17. The electronic device of claim 1,
wherein the pillar-shaped conductive pattern is not in direct contact with the variable resistance pattern.

* * * * *